United States Patent [19]

Hendriks et al.

[11] Patent Number: 4,843,636
[45] Date of Patent: Jun. 27, 1989

[54] TELEVISION RECEIVER HAVING AN AUTOMATIC RADIOFREQUENCY RESONANT CIRCUIT ADJUSTMENT CIRCUIT

[75] Inventors: Johannes H. Hendriks; Johannes H. A. Brekelmans; Johannes J. Bos, all of Eindhoven, Netherlands

[73] Assignee: U.S. Philips Corporation, New York, N.Y.

[21] Appl. No.: 170,568

[22] Filed: Mar. 14, 1988

Related U.S. Application Data

[63] Continuation of Ser. No. 775,067, Sep. 11, 1985, abandoned.

[30] Foreign Application Priority Data

Sep. 20, 1984 [NL] Netherlands ........................ 8402880

[51] Int. Cl.⁴ .......................................... H04B 11/16
[52] U.S. Cl. .................................... 455/192; 455/182; 455/184; 358/195.1
[58] Field of Search ............... 455/192, 197, 339, 340, 455/234, 184, 182, 200, 183; 358/195.1, 197; 331/15, 16; 334/13, 16

[56] References Cited

U.S. PATENT DOCUMENTS 4,141,092  2/1979  Orii .................................... 455/192
4,339,829  7/1982  Dimon ............................... 455/340

Primary Examiner—Benedict V. Safourek
Assistant Examiner—Curtis Kuntz
Attorney, Agent, or Firm—Edward W. Goodman

[57] ABSTRACT

In a television receiver having an automatic adjustment circuit for a radio frequency resonant circuit (3) of the receiver, using two carriers fed to the read frequency input of the receiver, the product of the amplitudes of the two carriers is formed by means of a detection circuit (37) coupled to an output (5) of the radio frequency circuit (3) and the adjustment setting of the resonant circuit is effected to a maximum value of this product (at 77), thus providing a simple, correct adjustment.

16 Claims, 4 Drawing Sheets

TELEVISION RECEIVER HAVING AN AUTOMATIC RADIOFREQUENCY RESONANT CIRCUIT ADJUSTMENT CIRCUIT

This is a continuation of application Ser. No. 775,067, filed Sept. 11, 1985 now abandon.

BACKGROUND OF THE INVENTION

The invention relates to a television receiver comprising an automatic radio-frequency resonant circuit adjustment circuit in which a setting signal is produced for a correct setting of a radio-frequency resonant circuit with the aid of two carriers to be applied to a radio frequency section of the receiver and of an output signal of a detection circuit coupled to an output of the radio frequency section.

European Patent Application No. 0 109 661 discloses a television receiver of the above-described type, in which the two carriers are sequentially applied to the radio frequency section of the receiver and a detector connected to the output of the radio frequency section of the receiver applies a signal to a microprocessor which in response thereto detunes the radio frequency circuits of the radio frequency section in a way not further described, until the tuning curve satisfies a predetermined criterion.

SUMMARY OF THE INVENTION

The invention has for its object to provide an adjustment circuit which is insensitive to the mutual amplitude ratio of the two carriers.

According to the invention, a television receiver of the type described in the opening paragraph is therefore characterized in that the detection circuit comprises a circuit for making the setting signal dependent on predominantly the product of the amplitudes of the two carriers, while the adjustment circuit is arranged for adjusting this setting signal to a maximum value.

Applicants have found that with such an adjustment to the maximum value of predominantly the product of the amplitudes of the two carriers the tuning circuit always adjusts itself to the correct tuning, independent of the amplitude ratio of the two carriers.

A television receiver according to the invention is therefore very suitable for effecting the automatic setting of the radio frequency resonant circuits to a received transmitter signal in which the amplitude of each of the two carriers may have any random value.

A continuously operative adjustment which must not always start from a predetermined initial position on a tuning curve can be obtained by providing the detection circuit with a differentiating circuit for forming an amplitude product change from the setting signal. A tuning signal for the radio frequency circuit is obtained from a tuning signal changing circuit controlled by the differentiating circuit. The tuning signal changing circuit comprises a circuit for making the sign of a tuning signal change produced by the tuning signal changing circuit dependent on the product of the sign of the amplitude product change in response to a tuning signal change and the sign of the previous tuning signal change.

BRIEF DESCRIPTION OF THE DRAWINGS

The invention will now be described in greater detail by way of example with reference to the accompanying drawings.

In the drawings.

DETAILED DESCRIPTION OF THE INVENTION

Figure 1:
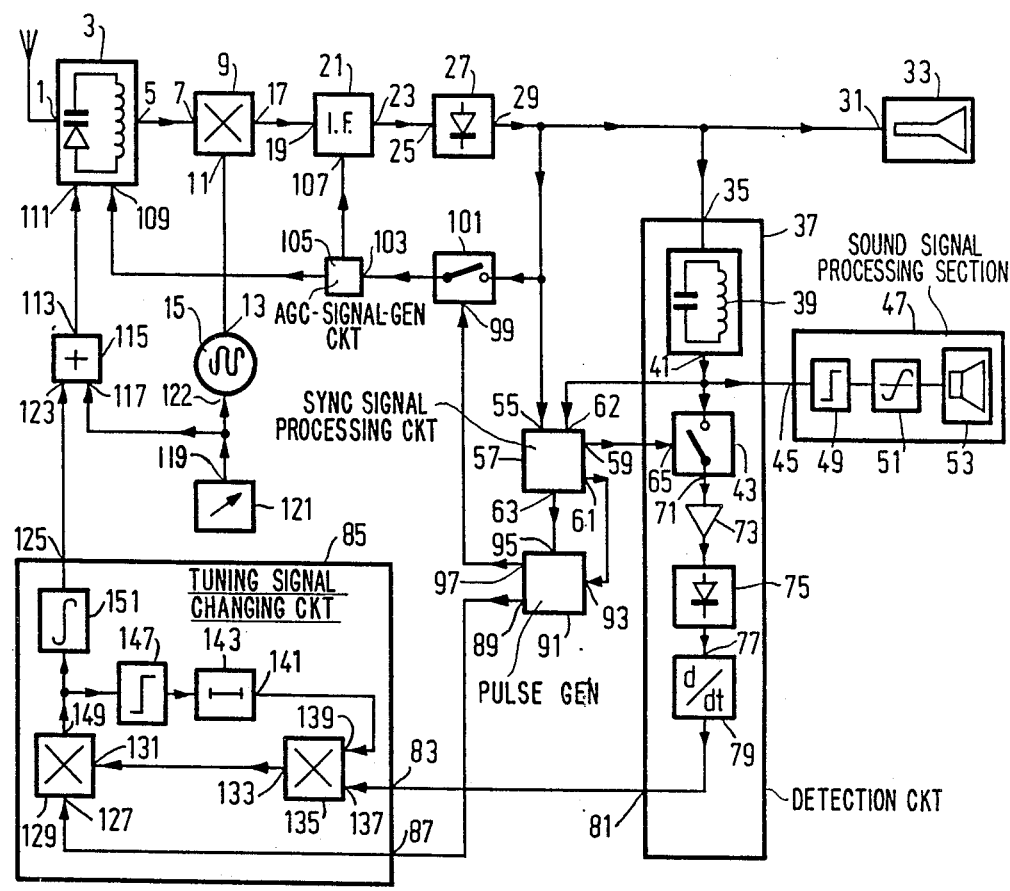
FIG. 1 illustrates by means of a block circuit diagram a television receiver according to the invention.

In FIG. 1, a received television signal containing a picture carrier and a sound carrier is applied to an input 1 of a radio frequency section 3. This television signal is amplified and applied to an input 7 of a mixing section 9 via an output 5.

The mixing section 9 further has an input 11 to which an oscillator signal originating from an output 13 of an oscillator 15 is applied. An intermediate frequency signal is then obtained from an output 17 of the mixing section 9 and applied to an input 19 of an intermediate frequency section 21.

An output 23 of the intermediate frequency section 21 then applies an amplified intermediate frequency signal to an input 25 of a demodulator 27. In response thereto, a video signal and an intercarrier signal are produced at an output 29 of the demodulator 27. This intercarrier signal has the differential frequency between the frequencies of the picture carrier and the sound carrier and its amplitude depends on the product of the amplitudes of the picture carrier and the sound carrier.

The signal at the output 29 of the demodulator 27 is applied to an input 31 of a picture display section 33, which processes the video signal, and is applied to an input 35 of a detection circuit 37 in which it is applied to a filter 39 tuned to the intercarrier frequency.

This filter 39 has an output 41 at which only the intercarrier signal occurs, which is applied to a gate circuit 43 and to an input 45 of a sound signal processing section 47. This sound signal processing section 47 comprises, for example, as is customary, a limiter-amplifier 49, a frequency demodulator 51 and a low-frequency section 53.

The output 29 of the demodulator 27 is further connected to an input 55 of a synchronizing signal processing circuit 57 which derives from the demodulated television signal a pulse signal of the line frequency, which is applied to an output 59, and a field-frequency clock signal which is applied to an output 61. A further input 62 of the synchronizing signal processing circuit 57 is connected to the output 41 of the filter 39 and receives therefrom information about the presence of a sound signal. An identification signal indicating the presence or absence of the picture and sound carriers is supplied from an output 63 of the synchronzing signal processing circuit 57.

A gate signal input 65 of the gate circuit 43 receives from the output 59 of the synchronizing signal processing circuit 57 a gate signal which renders the gate circuit 43 conductive during the occurrence of the line synchronizing signals, as a result of which the signal at an output 71 of the gate circuit 43 has a picture content-independent amplitude. This signal which will be referred to as the setting signal, is applied from the output 71 of the gate circuit 43 to an input 77 of a differentiating circuit 79 via an amplifier 73 and an amplitude detector 75.

The differentiating circuit 79 applies to an output 81 of the detection circuit 37 a signal whose sign and amplitude depend on the amplitude change of the output signal of the amplitude detector 75 and consequently on the amplitude change of the amplitude product of the two carriers. This signal is applied to an input 83 of a tuning signal changing circuit 85.

The tuning signal changing circuit 85 has a further input 87 which receives a pulse signal from an output 89 of a pulse generator 91.

The pulse generator 91 receives at an input 93 the field-frequency clock signal originating from the output 61 of the synchronizing signal processing circuit 57 and at an input 95 the identification signal originating from the output 63 of the synchronizing signal processing circuit 57, in response to which the pulse generator 91 is stopped if no picture or sound carrier is received. An output 97 of the pulse generator 91 applies a gate signal to a gate signal input 99 of a gate circuit 101.

As a result thereof, the gate circuit 101 periodically connects the output 29 of the demodulator 27 to an input 103 of an AGC-signal generating circuit 105 in the presence of a picture and sound signal and continuously in the absence of a picture and/or a sound signal. The AGC-signal generating circuit 105 applies an AGC-signal to an input 107 of the intermediate frequency section 21 and to an input 109 of the radio frequency section 3.

In addition, the radio frequency section 3 has a tuning signal input 111 which from an output 113 of a combining circuit 115 receives a tuning signal which determines the tuning of one or several resonant circuits in the radio frequency section 3. In this case the tuning signal is formed by a combination of an oscillator-tuning signal applied to an input 117 and originating from an output 119 of a tuning circuit 121, and which is also applied to a tuning signal input 122 of the oscillator 15, and a tuning correction signal applied to an input 123 and originating from an output 125 of the tuning signal changing circuit 85.

The tuning correction signal at the output 125 of the tuning signal changing circuit 85 now adjusts itself to such a value that a tuning signal change generated by a pulse at the input 87 of the tuning signal changing circuit 85 produces a minimal product amplitude change at the input 83 of the tuning signal changing circuit 85 and the radio frequency circuits are consequently tuned such that the product amplitude acting as a resonant signal is at its maximum at the output of the amplitude detector 75.

To that end the input 87 of the tuning signal changing circuit 85 is connected to an input 127 of a multiplier 129, a further input 131 of which is connected to an output 133 of a further multiplier 135 which has an input 137 connected to the input 83 of the tuning signal changing circuit 85 and a further input 139 of which is connected to an output 141 of a delay circuit 143. An input 145 of the delay circuit 143 is coupled via a limiter 147 to an output 159 of the multiplier 120, this output 149 further being coupled to the output 125 of the tuning signal changing circuit 85 via an integration circuit 151.

The multipliers 129 and 135 form together with the delay circuit 143 and the limiter 147 a step generating circuit which has for its object to produce a tuning step of the radio frequency section 3. A pulse received at the input 127 of the multiplier 129 is supplied at its output 149 with a sign and an amplitude determined by the sign and the amplitude of the signal at its input 131. The sign of this signal depends on the sign of each of the signals at the inputs 137 and 139 of the further multiplier 135 and the amplitude depends only on the amplitude of the signal at the input 137, since the limiter 147 is operative in the signal path to the input 139. The signal at the input 139 of the further multiplier 135 has the sign of the previous step at the output 139 of the multiplier 129 and the signal at the input 137 of the further multiplier 139 has the signal and the amplitude of the change in the tuning of the radio frequency section 3 caused by the preceding step via the integration circuit 151, and consequently of the product amplitude change at the output 81 of the detection circuit 37. As a result thereof, the tuning of the radio frequency section 3 is adjusted to a minimum value of the product amplitude change at the output 81 of the detection circuit 37 corresponding with the maximum value of the product of the amplitudes of the carriers, it being found in practice that this accomplishes a correct tuning for all the ratios of the amplitudes.

As the sign of the subsequent step depends on the sign of the preceding step and on the sign of the product amplitude change produced thereby, the setting operation need not be stopped upon reaching the maximum amplitude product; when this maximum is exceeded the control direction automatically reverses.

During the occurrence of a tuning signal change and the subsequent reaction of the adjustment circuit, the AGC is switched off in response to the signal at the input 99 of the gate circuit 101. The pulse generator 91 can be of such a structure that a tuning action and a setting action occur alternately. An example thereof will be given in the sequel.

Instead of a continuously operative automatic tuning to a received transmitter signal it is, if so desired, alternatively possible to tune once, for example for channel selection, to a signal combination with two carriers which combination is applied to an input of the radio frequency section 3 and is possibly generated by the receiver, whereafter the result can be stored in a memory.

Particularly when a continuously operative radio frequency resonant circuit is used, the last portion to the intermediate frequency section is preferably split into a portion for obtaining the video signal and a portion for obtaining the setting signal for the radio frequency resonant circuit adjustment. In the portion for obtaining the video signal a continuously operative AGC can then be used to prevent the radio frequency resonant circuit from adjustment producing interference in a displayed picture.

So as to render a circuit for the automatic adjustment of a radio frequency resonant circuit to a received transmitter signal also suitable for adjusting upon a weak received transmitter signal, it will be obvious that the presetting of the radio frequency resonant circuits must satisfy higher requirements than for the adjustment upon a stronger transmitter signal.

Although a simple way of obtaining the setting signal, in this case the product amplitude, is described in the foregoing, it will be obvious that alternatively other possibilities are suitable to accomplish this. Thus, the amplitude of each of the carriers can be detected synchronously or non-synchronously, and the detected values can be multiplied by each other or the amplitude of a carrier can be detected first and the detected value be multiplied with the amplitude of the other carrier, whereafter the amplitude of the other carrier is detected. Optionally, with the aid of a detected carrier, an addition to or a multiplication of the amplitude product can be utilized in order to obtain the setting signal at the input 77 of the differentiating circuit 79.

With an appropriate structure of the detection circuit, also periodically occurring carrier signals, such as, for example, the colour synchronizing signal or the teletext synchronizing signal can, if so desired, be used for the automatic adjustment. The use of the alternately occurring, locally generated carrier is then alternatively possible. The detection circuit may optionally be arranged in a different place in the receiver, for example at the output of the radio frequency section.

The automatic adjustment to a maximum of the product amplitude-dependent setting signal may further also be used for other resonant circuits arranged before the detection circuit.

Although a coupling of the radio frequency resonant circuit tuning to the oscillator tuning via the combining circuit 115 as described results in a fast adjustment, such a coupling is not absolutely necessary, if so desired the two tuning operations can be made independent of each other.

In this case the pulse generator 91 is controlled by field-frequency pulses. Other pulse frequencies, such as for example, the line frequency may alternatively be used.

When a microprocessor is used in the television receiver, this processor may include a portion of the adjustment circuit. Preferably, the output signal of the differentiating circuit is then converted for processing in the microprocessor into a digital signal, since such a digital signal requires little bit space.

Figure 2:
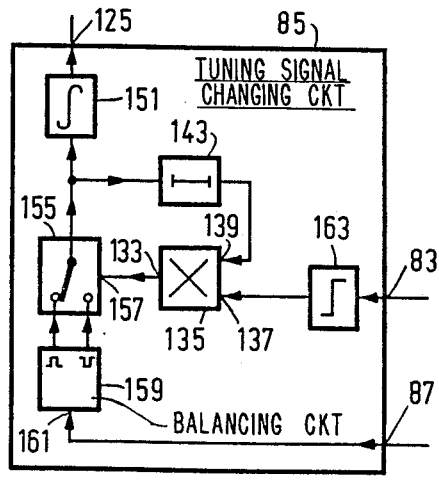
FIG. 2 illustrates by means of a block circuit diagram a possible embodiment of a tuning signal changing circuit for a television receiver according to the invention.

FIG. 2 shows an alternative embodiment of the tuning signal changing circuit 85. Components corresponding with those in FIG. 1 are given the same reference numerals.

The combination of multiplier 129 and limiter 147 of FIG. 1 is here replaced by a change-over switch 155, a switching signal input 157 of which is connected to the output 133 of the further multiplier 135, and a balancing circuit 159, an input 161 of which is connected to the input 87 of the tuning signal changing circuit 85. A limiter 163 is arranged between the input 83 of the tuning signal changing circuit 85 and the input 137 of the further multiplier 145, so that the amplitude of the signal at the input 83 does not affect the step generation.

Figure 3:
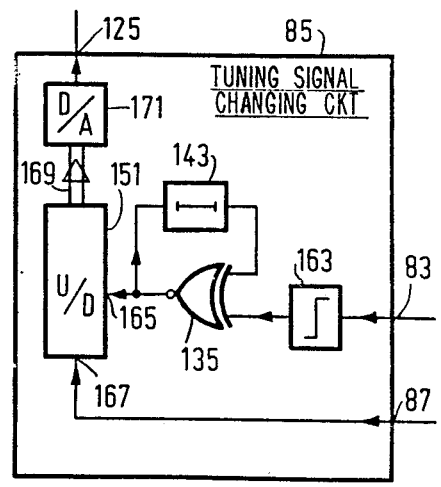
FIG. 3 illustrates by means of a block circuit diagram a further possible embodiment of a tuning signal changing circuit for a television receiver according to the invention.

FIG. 3 shows a possible, more digital, embodiment of a tuning signal generating circuit 85. Components corresponding to those in the preceding FIGS. are given the same reference numerals.

The further multiplier 135 is here constituted by an inverting exclusive-OR gate, while the function of the multiplier 129 of FIG. 1 is performed by an up/down input 165 of the up/down counter 151, which serves as an integrator and a counting signal input 167 of which is connected to the input 87 of the tuning signal changing circuit 85. An output combination 169 of the counter 151 is coupled to the output 125 of the tuning signal changing circuit 85 via a digital-to-analog converter 171.

Figure 4:
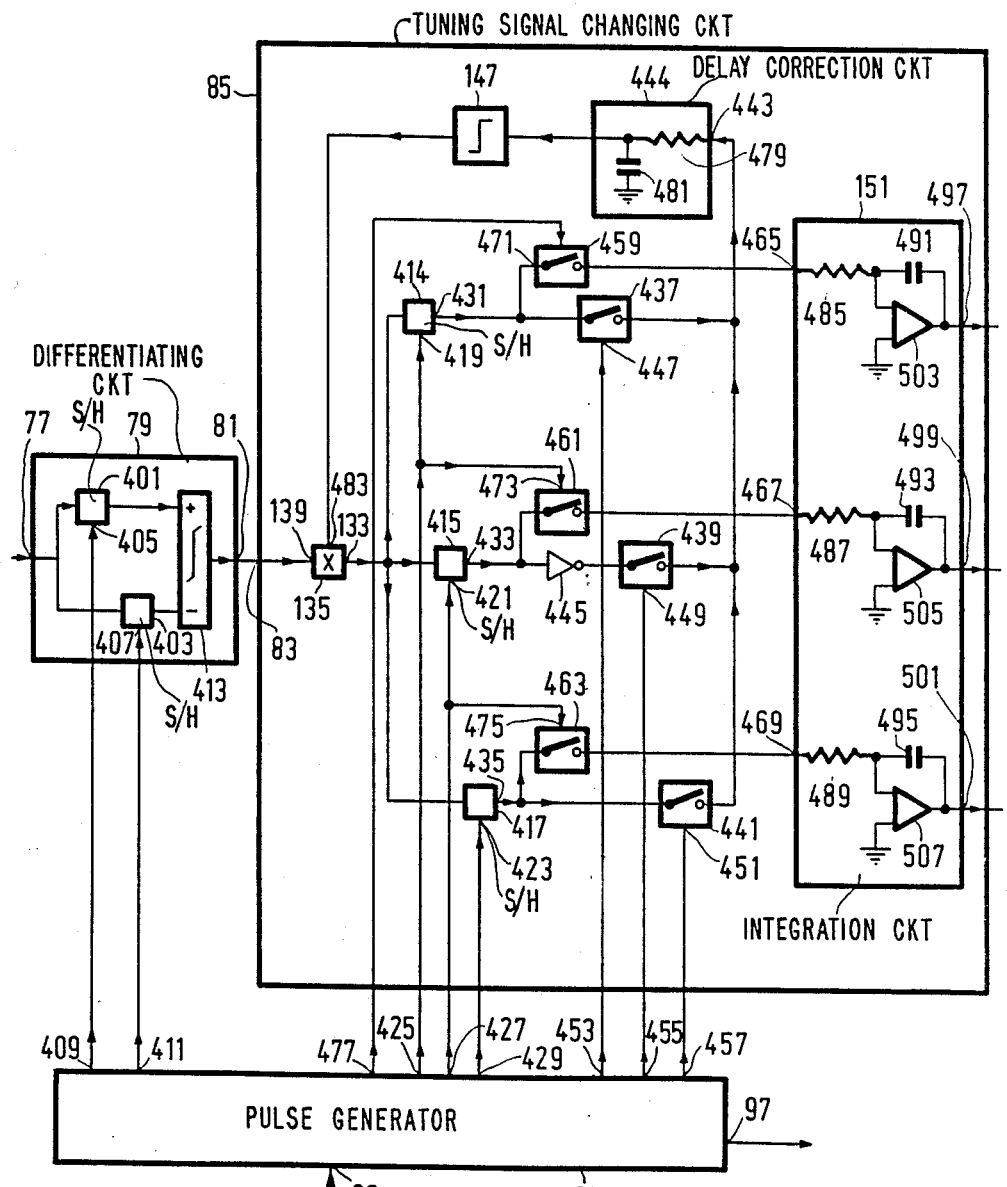
FIG. 4 illustrates by means of a block circuit diagram a possible embodiment of a portion of an adjustment circuit for a television receiver according to the invention comprising a plurality of radio frequency resonant circuits to be adjusted.

FIG. 4 is an example of how a differentiating circuit 79 and a tuning signal changing circuit 85 can be constructed if three radio-frequency resonant circuit must be automatically adjusted. Components corresponding to those in the preceding FIGS. are given the same reference numerals. The number of circuit components is limited by an advantageous use of sample-and-hold circuits and gate circuits and a special differentiating circuit.

Figure 6:
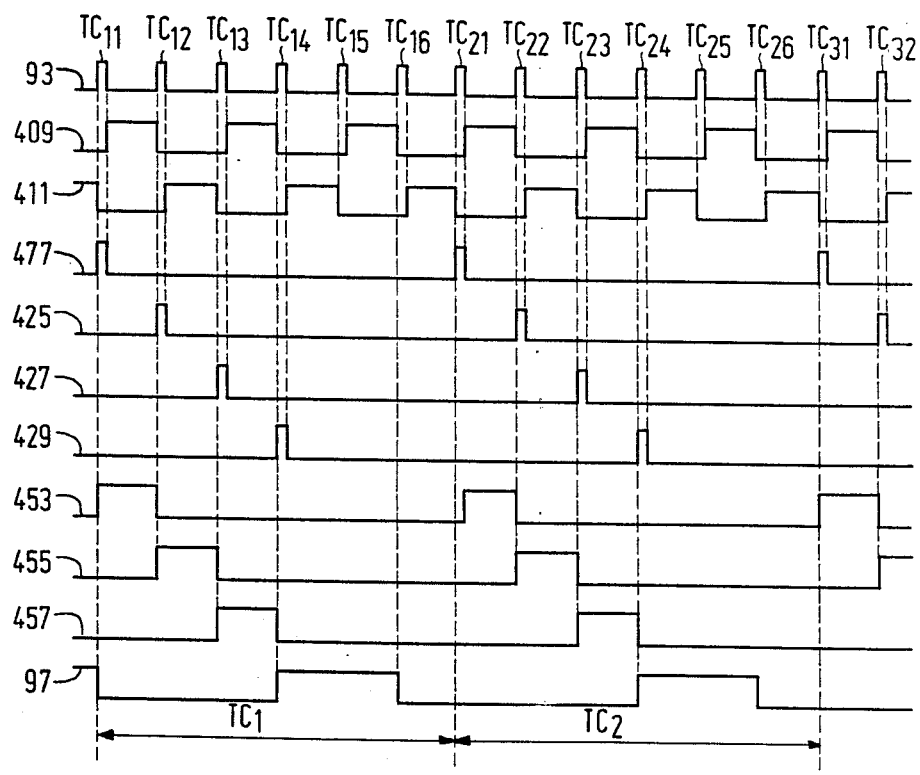

In FIG. 6 the waveforms of the input and outputs of the pulse generator 91 are given the same reference numerals as the relevant input and outputs of said pulse generator 91 in FIG. 4.

The differentiating circuit 79 has two sample-and-hold circuits 401 and 403, respectively which are connected to the input 77 and whose sampling signal inputs 405 and 407, respectively are connected to respective outputs 409 and 411 of the pulse generator 91. As a result thereof the input 77 is alternately sampled between two field pulses by one of the sample-and-hold circuits 401 or 403. A differential amplifier 413, which preferably has a smaller gain at large input signal amplitude than at small input amplitudes, amplifies the difference between the output signals of the sample-and-hold circuits 401 and 403 and applies this amplified difference to the output 81 of the differentiating circuit 79. As the product amplitude change must always be the difference between the subsequent and the preceding sample, a sign change in the signal at the output 81 of the differentiating circuit 79 which occurs from field period to field period must always be taken into account.

This signal is applied from the output 81 of the differentiating circuit 79 to the multiplier 135, whose output 133 is first sampled by a sample-and-hold circuit 414 and thereafter by a sample-and-hold circuit 415, 417, respective sampling signal inputs 419 and 421, 423 of which are connected to outputs 425 and 425, 429, respectively of the pulse generator 91.

Outputs 431 and 433, 435, respectively of the respective sampling-and-hold circuits 414 and 415, 417 are coupled to an input 443 of a delay correction circuit 444 via a gate circuit 437 and 439, 441 respectively. To correct the above-mentioned sign change in the signal at the output 81 of the differentiating circuit 79 an inverting circuit 445 is further included in the signal path from the output 443 of the sample-and-hold circuit 415 to the input 443. Gate signal inputs 447 and 449, 451, respectively, of the respective gate circuits 437 and 439, 441 are connected to outputs 453 and 455, 457, respectively of the pulse generator 91.

The outputs 431, 433 and 435, respectively of the respective sample-and-hold circuits 414, 415 and 417 are further coupled to inputs 465, 467 and 469, respectively of the integrating circuit 151 via gate circuits 459, 461 and 463, respectively. Gate signal inputs 471, 473 and 475, respectively of the respective gate circuits 459, 461 and 463 are connected to an output 477 and to the respective outputs 425 and 427 of the pulse generator 91.

The delay correction circuit 444 comprises a series arrangement of a resistor 479 of for example 62 kOhm and a capacitor 481 of, for example, 0.1 μF whose other terminal is connected to ground. The junction of the resistor 479 and the capacitor 481 is coupled to an input 483 of the multiplier 135 via the limiter 147.

The respective inputs 465, 467 and 469 of the integration circuit 151 are connected via a series arrangement of resistors 485, 487 and 489, respectively having a value of, for example, 40 kOhm and capacitors 491, 493 and 495, respectively of, for example, 0.047 $\mu$F to respective outputs 497, 499 and 501, from which the correction signal for the relevant radio frequency circuit can be taken off. The junction of the respective resistors 485, 487 and 489 and the respective capacitors 491, 493 and 495 is connected to an input of amplifiers 503, 505 and 507 respectively, whose other inputs are connected to ground and the outputs to the outputs 497, 499 and 501, respectively of the integrating circuit 151.

The operation of the circuit of FIG. 4 will now be described in detail with reference to the waveforms of FIG. 6.

In FIG. 6, two adjustment cycles $TC_1$ and $TC_2$ are denoted by an even number, in this case six, of field periods, starting with a clock pulse $TC_{11}$, $TC_{12}$, $TC_{13}$, $TC_{14}$, $TC_{15}$, $TC_{16}$, $TC_{21}$, $TC_{22}$, $TC_{23}$, $TC_{24}$, $TC_{25}$, $TC_{26}$.

In response to the waveform 97, the AGC-loop of the receiver is only closed in the field periods starting with the clock pulses $TC_{14}$ and $TC_{15}$ and $TC_{24}$, $TC_{25}$, respectively and the AGC voltage then obtained is preserved in the remaining portion of the adjustment cycles until the AGC-loop is closed again, this last situation being referred to as the hold state of the AGC.

In the field period starting with the clock pulse $TC_{16}$, the AGC is consequently in the holding state. The input 77 of the differentiating circuit 79 is sampled between $TC_{16}$ and $TC_{21}$ by the sample-and-hold circuit 403 in response to the waveform 411. During the subsequent field period the differentiating circuit 79 is sampled between $TC_{21}$ and $TC_{22}$ by the sample-and-hold circuit 401 in response to the waveform 409. Then, at the output 81 of the differentiating circuit 79 the change in the product amplitude at the input 77 of the differentiating circuit produced during the occurrence of the clock pulse $TC_{21}$ occurs. This change is caused by the pulse supplied by the gate circuit 459 in response to the waveform 477, which pulse is integrated between the input 465 and the output 497 of the integrating circuit 151 and produces a tuning step. Thus the sign and the amplitude of this pulse determine the sign and the amplitude of the tuning step.

The product amplitude change in response to the tuning step caused during the occurrence of the pulse at the clock instant $TC_{21}$ of the integrated circuit 151 is conveyed by the multiplier 135 to its output 133 with a sign which is also determined by the sign signal at its input 483 and which originates from the limiter 147. This sign of the signal at the output 133 remains therefore equal to the sign of the sign signal at the input 483 as long as the product amplitude change at the output 81 of the differentiating circuit 79 is positive.

The signal level at the output 133 of the multiplier 135 is stored by the sample-and-hold circuit 413 at the end of the period between the clock signals $TC_{21}$ and $TC_{22}$ at the occurrence of the clock signal $TC_{21}$ in response to the waveform 425, and remains there until the subsequent sampling operation by the sample-and-hold circuit 413 with the waveform 425 at the occurrence of the clock signal $TC_{32}$. Prior to the occurrence of the clock signal $TC_{22}$ the output level of the multiplier 135 at the occurrence of the clock signal $TC_{12}$ is produced by the tuning step during the occurrence of the clock signal $TC_{11}$ was present at the output 431 of the sample-and-hold circuit 413.

In response to the waveform 453 the gate circuit 437 is conducting from the occurrence of the clock signal $TC_{21}$ until the occurrence of the clock signal $TC_{22}$. As a result thereof, the sign of the signal at the input 483 of the multiplier 135 is determined via the delay correction circuit 444 and the limiter 147 by the sign of the output signal of the sample-and-hold circuit 413 which, for the relevant radio frequency resonant circuit, was also the sign of the preceding tuning step occurring at the output 497 of the integration circuit 151 at the occurrence of the clock signal $TC_{11}$.

At long as the product amplitude change at the input 139 of the multiplier 135 remains positive, which implies that the control direction for the relevant radio frequency circuit is correct, the sign of the output signal of the multiplier 135 and consequently the sign of the tuning step are preserved. Thus, a sign inversion only occurs when the product amplitude change becomes negative, which means that the tuning of the relevant radio frequency circuit has been driven beyond its maximum and the control direction must therefore be corrected.

It will also be obvious that the sample-and-hold circuits 415 and 417 with the respective gate circuits 461, 439 and 463, 441 for the other radio frequency circuits have for their object to determined the control direction and the values of the tuning steps therefor.

The sample-and-hold circuits 414, 415 and 417, respectively together with the respective gate circuits 437, 439 and 441 and the delay correction circuit 444 perform in this situation also the function of the delay circuit referred to in the preceding FIGS. by reference numeral 143.

Figure 5:
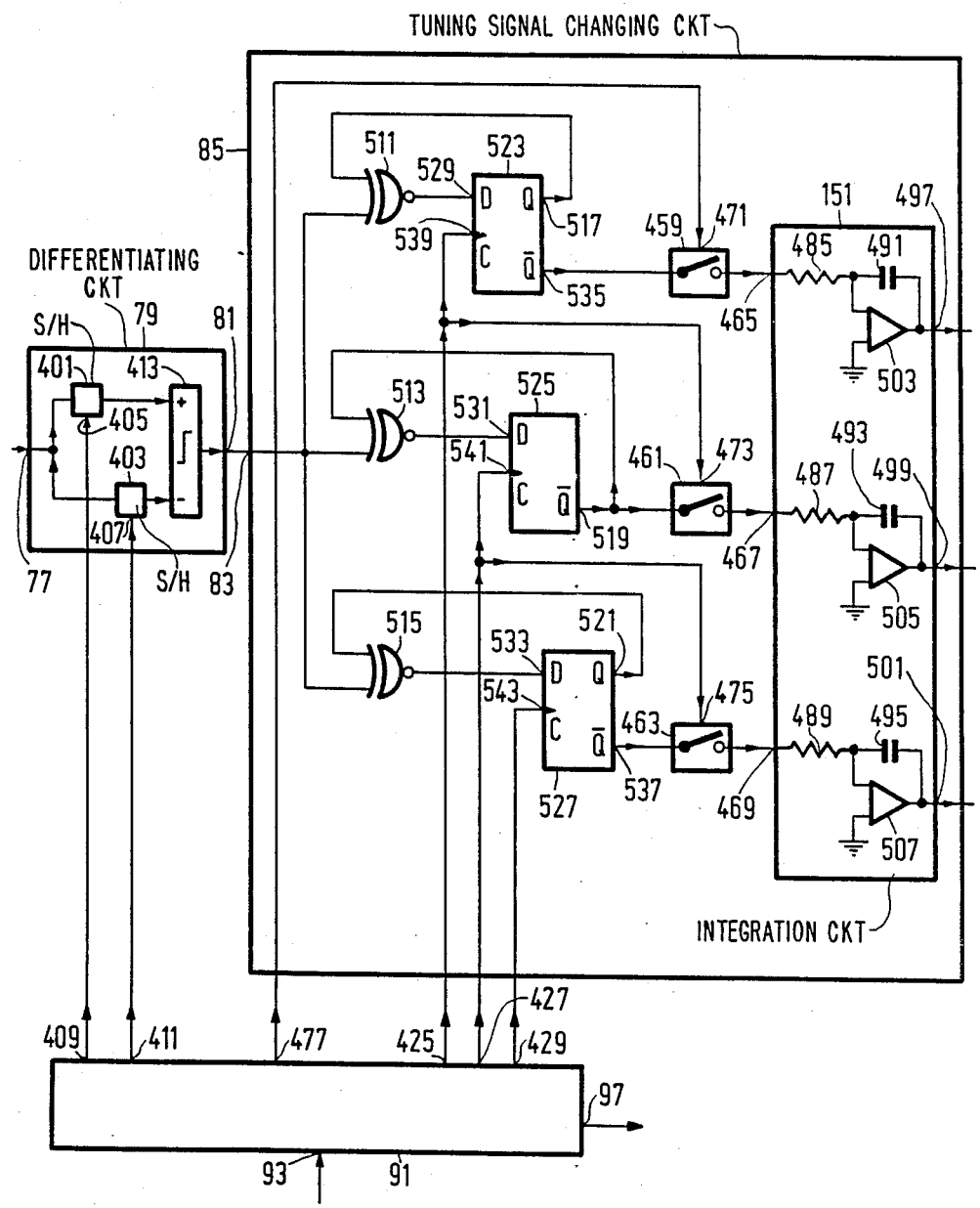
FIG. 5 illustrates by means of a block circuit diagram a further possible embodiment of a portion of an adjustment circuit for a television receiver according to the invention comprising a plurality of radio frequency resonant circuits to be adjusted and FIG. 6 illustrates a number of waveforms occurring in the circuit of FIGS. 4 and 5.

In FIG. 5, in which components corresponding to those in the preceding FIGS. are given the same reference numerals, the gate circuits 437, 439 and 441, respectively together with the delay circuit 444, the limiter 147 and the multiplier 135 of FIG. 4, are replaced by inverting exclusive-OR gates 511, 513 and 515, respectively an input of which is connected to the input 83 of the tuning signal changing circuit 85 and the other input is connected to a Q-output 517, a $\overline{Q}$-output 519 and to a Q-output 521 respectively of the respective D-flipflops 523, 525 and 527.

The D-flipflops 523, 525 and 527 perform the functions of the respective sample-and-hold circuits 414, 415 and 417 of FIG. 4, in this case only sign storage and no amplitude storage being effected. D-inputs 529, 531, and 533, respectively of the D-flip-flops 523, 525 and 527 are connected to the output of the respective inverting exclusive-OR gates 511, 513 and 515 and $\overline{Q}$-outputs 535, 519 and 537, respectively are connected to the respective inputs 465, 467 and 469 of the integrating circuit 151 via the respective circuits 459, 461 and 463.

The outputs 453, 455 and 457 of the pulse generator 91 of FIG. 5 are now omitted, in all further respects the pulse generator 91 is identical to the pulse generator of FIG. 4, and also the waveforms of FIG. 6 hold, whose reference numerals correspond to those of the relevant input of the pulse generator 91.

The outputs 425, 427 and 429 respectively of the pulse generator 91 are now not connected to the respective inputs 419, 421 and 423 of the respective sample-and-hold circuits 414, 415 and 417 of FIG. 4, but to a clock signal input C 539, 541 and 547 of the respective D-flipflops 539, 541 and 543.

As the D-flipflops cannot provide amplitude storage the differential amplifier 413 of the differentiating circuit 79 is constituted by a limiter.

The sign inversion effected in the circuit of FIG. 4 by the inverting circuit 445 is here obtained by using the $\bar{Q}$-output 519 of the D-flipflop for sign feed-back to the inverting exclusive-OR gate 513 instead of using the Q-outputs 517 and 521, respectively of the respective D-flipflops 523 and 527 for the sign feedback to the inverting exclusive-OR gates 511 and 515, respectively.

After, as also holds for in the circuit of FIG. 4, the AGC has been operative in the field period starting with the clock pulses $TC_{14}$ and $TC_{15}$ and the AGC has reached the hold state in the period $TC_{16}$, the gate circuit 459 applied a pulse to the input 465 of the integrating circuit 151 in response to the waveform 477 at the occurrence of the clock pulse $TC_{21}$, causing a tuning step to be produced at the output 497. The supply voltages for the D-flipflops have been chosen such that their outputs can assume a positive or a negative value, so the pulse produced by the tuning step may be a positively or negatively-going pulse, thus determining the sign of the tuning step.

The differentiating circuit 79 operates as described with reference to FIG. 4 and, during the period between the clock pulses $TC_{21}$ and $TC_{22}$ applies the sign of the product amplitude change in response to the tuning step to the relevant input of the inverting exclusive-OR gate 511. At the other input of the inverting exclusive-OR gate 511 there still is the sign the D-flipflop 523 stored in response to the waveform 425 during the clock pulse $TC_{12}$. If the sign of the product amplitude change produced is positive, which implies that the tuning circuit has the correct control direction, then the occurrence of the clock pulse $TC_{22}$ as the result of the operation of the inverting exclusive-OR gate 511 causes this sign at the output 517 of the D-flipflop to be stored again in response to the waveform 525 at its clock signal input 539. If the sign of the product amplitude change is negative, then the stored sign becomes the inverse of the sign at the output 517 and the control direction of the tuning circuit reverses.

In this case the gate circuits 459, 461 and 463 are connected to the $\bar{Q}$-outputs 535, 519 and 537 of the D-flipflops 523, 525 and 527, which is provided in conjunction with the remaining portion, not shown, of the circuit by which also the sign of the product amplitude change is determined. If this circuit portion is of a different construction, it may be necessary to connect the Q-output of the D-flipflops to said gate circuits.

In some cases it may be necessary to have the value of a tuning step also depend on, for example, the selected wave range. In the circuit of FIG. 4, this can be effected in a simple way by providing an adjustable attenuator at the output of the limiter 147. In the embodiment of FIG. 5 and adjustable attenuator might then, for example, be provided in each of the signal paths from the flip-flops 523, 525, 527 to the gate circuit 459, 461, 463.

A television receiver must here also be understood to mean each set comprising the circuits further specified in the Claims but from which a picture and/or sound reproducing section is missing, for example a video recorder, a tuner, a portion of a community antenna system etc.

We claim:

1. A television receiver comprising a radio frequency section having a radio frequency resonant circuit; and an automatic adjustment circuit for adjusting said radio frequency resonant circuit, said automatic adjustment circuit having outputs coupled to inputs of said radio frequency resonant circuit and producing a setting signal, and a detection circuit coupled to an output of said radio frequency section, said radio frequency resonant circuit being correctly adjusted in response to said setting signal with the aid of two carriers, applied to said radio frequency section, and by an output signal of said detection circuit, characterized in that the detection circuit comprises means, coupled to inputs of said detection circuit, for causing the setting signal to substantially correspond to the product of the amplitudes of the two carriers, said automatic adjustment circuit adjusting said setting signal to a maximum value.

2. A television receiver as claimed in claim 1, characterized in that the two carriers have frequencies corresponding to a picture carrier frequency and a sound carrier frequency, respectively, of a television signal, and the detection circuit comprises means for forming a signal having a frequency equal to the difference between the carrier frequencies and an amplitude substantially proportional to a product of the amplitudes of the two carriers, and means for detecting the amplitude of said signal.

3. A television receiver as claimed in claim 1, characterized in that said detection circuit comprises a differentiating circuit for producing a signal, derived from said setting signal, indicating a change in the product of the amplitudes of the two carriers, and that a tuning signal for the radio frequency section is obtained from a tuning signal changing circuit controlled by said signal produced by said differentiating circuit, said tuning signal changing circuit comprising means for making a sign of a tuning signal change dependent on the product of a sign of said change in the product of the amplitudes of the two carriers in response to said tuning signal change, and a sign of a preceding tuning signal change.

4. A television receiver as claimed in claim 3, wherein said automatic adjustment circuit performs and adjustment upon receiving a television signal, and said tuning signal changing circuit comprises a step generator circuit and an integration circuit coupled to an output of said step generator circuit, characterized in that the tuning signal changing circuit is arranged so that the amplitude of a step in the tuning signal depends on the amplitude of a change in the product of the amplitudes of the two carriers.

5. A television receiver as claimed in of claim 1 or 2, wherein said automatic adjustment circuit sequentially adjusts several radio frequency resonant circuits during a periodically occurring adjustment cycle, and said detection circuit comprises a differentiating circuit for forming a product amplitude change, characterized in that the differentiating circuit comprises two sample-and-hold circuits for alternately sampling an input of said differentiating circuit, and a differential amplifier having a pair of inputs coupled, respectively, to outputs of said sample-and-hold circuits, and said adjustment cycle comprises an even number of periods of a clock signal, produced by clock signal generating means, controlling the adjustment.

6. A television receiver as claimed in claim 5, further comprising an AGC signal generating circuit coupled, at an input, to said detection circuit and coupled, at outputs, to said radio frequency resonant circuit in said radio frequency section, said AGC signal generating circuit not generating an AGC signal during an adjustment of said radio frequency resonant circuit, characterized in that during each portion of the adjustment cycle in which a tuning operation is not effected, the AGC signal is generated by said AGC signal generating circuit.

7. A television receiver as claimed in any one of claims 1 or 2, characterized in that a tuning signal for said radio frequency section is obtained from an oscillator tuning signal for an oscillator, said tuning signal determining the tuning of the television receiver.

8. A television receiver as claimed in claim 2 or 4, wherein said detection circuit comprises a differentiating circuit for forming a product amplitude change, characterized in that the differentiating circuit comprises two sample-and-hold circuits for alternately sampling an input of said differentiating circuit, and a differential amplifier having a pair of inputs coupled, respectively, to outputs of said two sample-and-hold circuits, and said adjustment cycle comprises an even number of periods of a clock signal, produced by clock signal generating means, controlling the adjustment, and further characterized in that the differential amplifier has a gain which decreases as the input amplitude increases.

9. A television receiver as claimed in claim 5, characterized in that said automatic adjustment circuit further comprises a multiplier having an input coupled to an output of said differentiating circuit and an output coupled to a further input of said multiplier via a sample-and-hold circuit, while an output of said sample-and-hold circuit is coupled to an input of an integrating circuit via a gate circuit.

10. A television receiver as claimed in claim 5, characterized in that an output of said differentiating circuit is coupled to an input of an inverting exclusive-OR gate, an output of said inverting exclusive-OR gate being connected to a D-input of a D-flip-flop, an output of said D-flip-flop being coupled to the other input of said inverting exclusive-OR gate, while an output of said D-flip-flop is coupled to an input of an integrating circuit via a gate circuit.

11. A television receiver as claimed in claim 2, characterized in that said detection circuit comprises a differentiating circuit for producing a signal, derived from said setting signal, indicating a change in the product of the amplitudes of the two carriers, and that a tuning signal for said radio frequency section is obtained from a tuning signal changing circuit controlled by said signal produced by said differentiating circuit, said tuning signal changing circuit comprising means for making a sign of a tuning signal change dependent on the product of a sign of said change in the product of the amplitudes of the two carriers in response to said tuning signal change, and a sign of a preceding tuning signal change.

12. A television receiver as claimed in claim 11, wherein said automatic adjustment circuit performs an adjustment upon receiving a television signal, and said tuning signal changing circuit comprises a step generator circuit and an integration circuit coupled to an output of said step generator circuit, characterized in that the tuning signal changing circuit is arranged so that the amplitude of a step in the tuning signal depends on the amplitude of a change in the product of the amplitudes of the two carriers.

13. A television receiver as claimed in claim 6, characterized in that said automatic adjustment circuit further comprises a multiplier having an input coupled to an output of said differentiating circuit and an output coupled to a further input of said multiplier via a sample-and-hold circuit, while an output of said sample-and-hold circuit is coupled to an input of an integrating circuit via a gate circuit.

14. A television receiver as claimed in claim 6, characterized in that an output of said differentiating circuit is coupled to an input of an inverting exclusive-Or gate, an output of said inverting exclusive-OR gate being coupled to a D-input of a D-flip-flop, an output of said D-flip-flop being coupled to the other input of said inverting exclusive-OR gate, while an other output of said D-flip-flop is coupled to an input of an integrating circuit via a gate circuit.

15. A television receiver as claimed in any one of claims 1–4 or 11, 12, wherein said adjustment circuit performs an adjustment upon receiving a television signal, characterized in that said automatic adjustment circuit can be switched off by means of a transmitter identification signal.

16. A television receiver as claimed in claim 15, characterized in that the transmitter identification signal depends on the presence of both sound and the picture carriers in the received television signal.

* * * * *